US007603773B2

(12) United States Patent
Mills

(10) Patent No.: US 7,603,773 B2
(45) Date of Patent: Oct. 20, 2009

(54) TOWING VEHICLE RECEPTACLE ADAPTOR

(76) Inventor: James Lowell Mills, P.O. Box 1587, Barbourville, KY (US) 40906

( * ) Notice: Subject to any disclaimer, the term of this patent is extended or adjusted under 35 U.S.C. 154(b) by 0 days.

(21) Appl. No.: 11/975,535

(22) Filed: Oct. 19, 2007

(65) Prior Publication Data

US 2008/0096435 A1 Apr. 24, 2008

Related U.S. Application Data

(60) Provisional application No. 60/853,120, filed on Oct. 20, 2006.

(51) Int. Cl.
*H01S 5/00* (2006.01)

(52) U.S. Cl. ........................... 29/854; 29/876; 29/426.1

(58) Field of Classification Search .................. 439/34, 439/35, 638, 676; 29/854, 876, 426.1
See application file for complete search history.

(56) References Cited

U.S. PATENT DOCUMENTS 3,649,953 A 3/1972 Hoffman
4,109,988 A * 8/1978 Olson ......................... 439/638
4,270,835 A 6/1981 Kordt et al.
4,611,875 A * 9/1986 Clarke et al. ................ 439/638
4,842,524 A * 6/1989 Hopkins et al. ............... 439/35
5,328,390 A * 7/1994 Johnston et al. ............. 439/676
5,514,009 A * 5/1996 Hughes ....................... 439/35
5,651,690 A * 7/1997 Klas et al. ................... 439/638
5,902,148 A 5/1999 O'Rourke
6,218,952 B1 * 4/2001 Borland et al. .............. 340/641
6,390,824 B1 * 5/2002 Vance ......................... 439/35
6,749,438 B1 * 6/2004 Scheller et al. ............. 439/638
7,331,792 B2 * 2/2008 Cummings et al. ............ 439/35

* cited by examiner

*Primary Examiner*—Briggitte R Hammond
(74) *Attorney, Agent, or Firm*—Law Offices of Rita C. Chipperson, P.C.

(57) ABSTRACT

Disclosed are apparatus and methods for adapting a first receptacle coupled to a vehicle to power a second receptacle coupled to the vehicle without the need for modifying the vehicle's electrical system wiring. A method is provided in which a vehicle plug connected to the vehicle's electrical system is removed from a power inlet of the first receptacle, a first interface of the adaptor is plugged into the same power inlet, the vehicle plug is plugged into a second interface of the adaptor, and a third interface of the adaptor is coupled to the second receptacle. In some embodiments, the adaptor is provided with modules that replicate the interfaces of existing, standardized vehicle receptacles to increase compatibility with pre-installed vehicle receptacles. The adaptor may optionally be provided with an adaptor plug that wires to a second receptacle via terminal blocks or the like and plugs into the adaptor's third interface.

11 Claims, 7 Drawing Sheets

TOWING VEHICLE RECEPTACLE ADAPTOR

CROSS-REFERENCE TO RELATED APPLICATIONS

This application claims the benefit of the U.S. provisional patent application entitled "7-Way Plug Adaptor", having Ser. No. 60/853,120, filed Oct. 20, 2006, which is incorporated by reference in its entirety as if fully set forth herein.

BACKGROUND OF THE INVENTION

Embodiments of the present invention generally relate to systems and methods for adapting a first receptacle to power a second receptacle. More specifically, the present invention relates to systems and methods for adapting a first receptacle wired to a towing vehicle's electrical system to power a second receptacle with zero or minimal modification (e.g., cutting or splicing) of the towing vehicle's electrical system wiring.

Towing vehicle receptacles such as receptacles for use with a towed object (e.g., a vehicle, a cargo hold, a trailer such as a Gooseneck trailer, a camper, a fifth wheel, etc. to be towed by the towing vehicle) are known in the art. Such receptacles are typically included as standard equipment on vehicles equipped with a towing package. That is, the towing vehicle receptacle is typically pre-wired to the towing vehicle's electrical system (e.g., by the vehicle manufacturer or reseller) in a manner that allows the receptacle to provide power to a towed object. In many cases, this receptacle is mounted on or below the rear bumper of the vehicle in close proximity to the tow hitch. Towing vehicle receptacles are available in a wide variety of standardized forms including, without limitation, two-way receptacle (e.g., a 12-volt receptacle such as those use as a cigarette lighter receptacle, cell phone charger receptacle, etc.), four-way, five-way, six-way, and seven-way receptacles. These standardized receptacles facilitate insertion of standardized plugs that are typically included and pre-wired to objects to be towed such as trailers and the like. As used herein, the term "way" denotes the quantity of differing electrical connections. For example, the seven-way receptacle described herein has seven different electrical connections for electric brakes, taillights, 12V, ground, left turn, right turn, and auxiliary/backup even though it has eight electrical terminals due to the inclusion of two terminals for the same electrical connection of ground.

A typical standardized towing vehicle receptacle as known in the prior art is depicted in FIG. 2 as receptacle 202'. Receptacle 202' is typically mounted through an aperture such as receptacle aperture 216' of a commercially-available receptacle bracket such as partially shown receptacle bracket 216'. Receptacle bracket 214' may be integral to or detachable from any stationary part of the towing vehicle such as, for example, the towing hitch, the rear bumper, and extensions thereof.

Receptacle 202' includes two connection points, namely, power inlet 204' and power outlet 206'. Power inlet 204' is configured to receive plug 204', which is connected to the towing vehicle's electrical system via wiring bus 212'. In many cases, plug 204' is installed and wired to the towing vehicle's electrical system during the towing vehicle's manufacture; however, it may also be added at a later time. Connecting plug 204' to power inlet 204' provides power from the towing vehicle's electrical system to receptacle 202' and power outlet 206'.

Power outlet 206' is configured to receive a plug connected to the towed object's electrical system (i.e., the wiring connected to the towed object's brake lights, turn signals, etc.). Weatherproof cap 210' is typically included in receptacle 202' to protect power outlet 206' when it is not in use. Connecting the towed object's electrical system plug to power outlet 206' of receptacle 202' provides the power provided by the towing vehicle's electrical system via plug 204' and receptacle 202' to the towed object's electrical system. This allows the taillights, brake lights, turn signals, etc. of the towed object to operate as required by local and/or federal laws.

As depicted in FIG. 3, towing vehicle receptacle kits such as kit 300' are also known in the art. An example of one such kit 300' is the 7-Way Pre-Wired Car Connector, 7' Lead having model no. 20023 and manufactured by Draw-Tite. Such kits typically facilitate the addition of a second receptacle to a towing vehicle having a first receptacle or such kits may facilitate the addition of a first receptacle to a towing vehicle having no receptacles.

Kit 300' typically includes receptacle 302' and wiring harness 312'. Receptacle 302' includes two connection points, namely, power inlet 304' and power outlet 306'. Power inlet 304' is configured to receive plug 308', which is connected to a first end of wiring harness 312'. The second end of wiring harness 312' is typically connected to the towing vehicle's electrical system via splicing or other methods. Such connection typically involves disruption (e.g., cutting) of the towing vehicle's existing electrical system. After this connection is made, connecting plug 308' to power inlet 304' provides power from the towing vehicle's electrical system via wires 316', wiring harness 312', and plug 308' to receptacle 302' and power outlet 306'. Power outlet 306' is configured to receive a plug connected to the towed object's electrical system (i.e., the wiring connected to the towed object's brake lights, turn signals, etc.). Weatherproof cap 310' is typically included in receptacle 302' to protect power outlet 306' when it is not in use. Connecting the towed object's electrical system plug to power outlet 306' of receptacle 302' provides the power provided by the towing vehicle's electrical system via plug 308' and receptacle 302' to a plug inserted in power outlet 306'.

BRIEF SUMMARY OF THE INVENTION

A method for adapting a first towing vehicle receptacle coupled to an electrical system of a towing vehicle to power a second receptacle via said electrical system via an adaptor is also provided. This method includes the steps of: removing a towing vehicle plug connected to the electrical system of the towing vehicle from a power inlet of the first towing vehicle receptacle; inserting a first interface of the adaptor into the power inlet, the adaptor including: a housing; a first module located internal to the housing, the first module including the first interface, the first interface configured to mate with the power inlet; a second module located internal to the housing, the second module including a second interface, the second interface configured to mate with the towing vehicle plug, the second interface electrically connected to the first interface; and a third module located internal to the housing, the third module including a third interface configured to mate with a plurality of wires coupled to the second receptacle, the third interface electrically connected to the first interface and the second interface; inserting the towing vehicle plug into the second interface; and coupling the third interface to the second receptacle.

A second method for adapting a first towing vehicle receptacle coupled to an electrical system of a towing vehicle to power a second receptacle via the electrical system via an adaptor is also provided. This method includes the steps of: removing a towing vehicle plug connected to the electrical system of the towing vehicle from a power inlet of the first towing vehicle receptacle; inserting a first interface of the adaptor into the power inlet, the adaptor including: a housing; a first module located internal to the housing, the first module including the first interface, the first interface configured to mate with the power inlet; a second module located internal to the housing, the second module including a second interface, the second interface configured to mate with the towing vehicle plug, the second interface electrically connected to the first interface; a third module located internal to the housing, the third module including a third interface, the third interface electrically connected to the first interface and the second interface; and an adaptor plug, the adaptor plug configured to mate with the third interface, the adaptor plug configured to receive a plurality of wires coupled to the second receptacle; inserting the towing vehicle plug into the second interface; wiring the plurality of wires to the adaptor plug; and inserting the adaptor plug into the third interface.

A second method for adapting a first receptacle coupled to a vehicle to power a second receptacle coupled to the vehicle is also provided. This method includes the steps of: removing a vehicle plug connected to an electrical system of the vehicle from a power inlet of the first receptacle; inserting a first interface of an adaptor into the power inlet, the adaptor including: a housing; a first module located internal to the housing, the first module including a first interface configured to mate with a power inlet of the first receptacle; a second module located internal to the housing, the second module including a second interface configured to mate with a plug wired to an electrical system of the vehicle, the second interface electrically connected to the first interface; and a third module located internal to the housing, the third module including a third interface configured to mate with at least one of the group consisting of an adaptor plug, a plurality of wires, a receptacle kit wiring harness, and a receptacle kit wiring harness plug, the third interface electrically connected to the first interface and the second interface; inserting the vehicle plug into a second interface of the adaptor; and coupling a third interface of the adaptor to the second receptacle.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
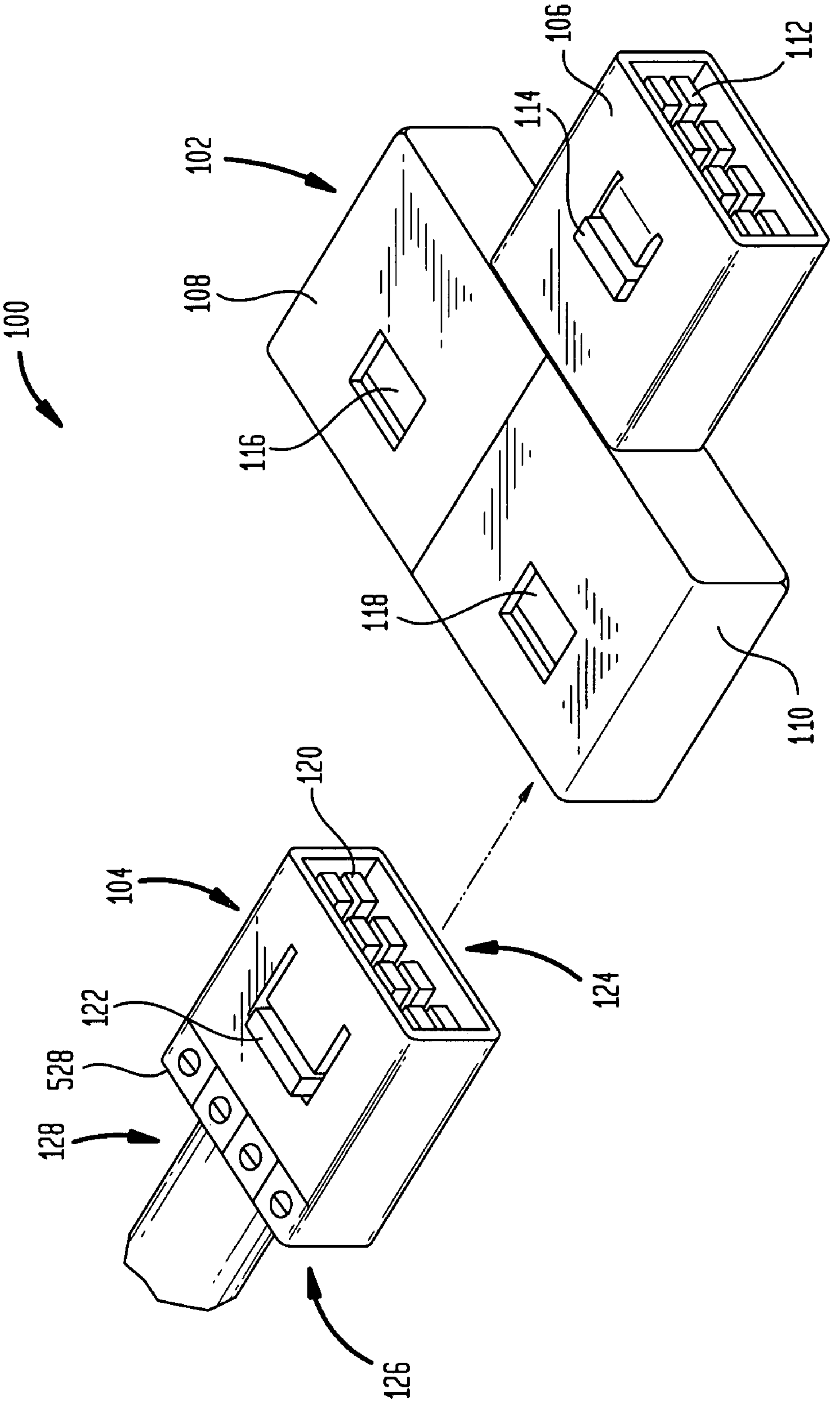
FIG. 1 is a perspective view of a receptacle adaptor having its adaptor plug removed in accordance with one embodiment of the present invention.
Figure 2:
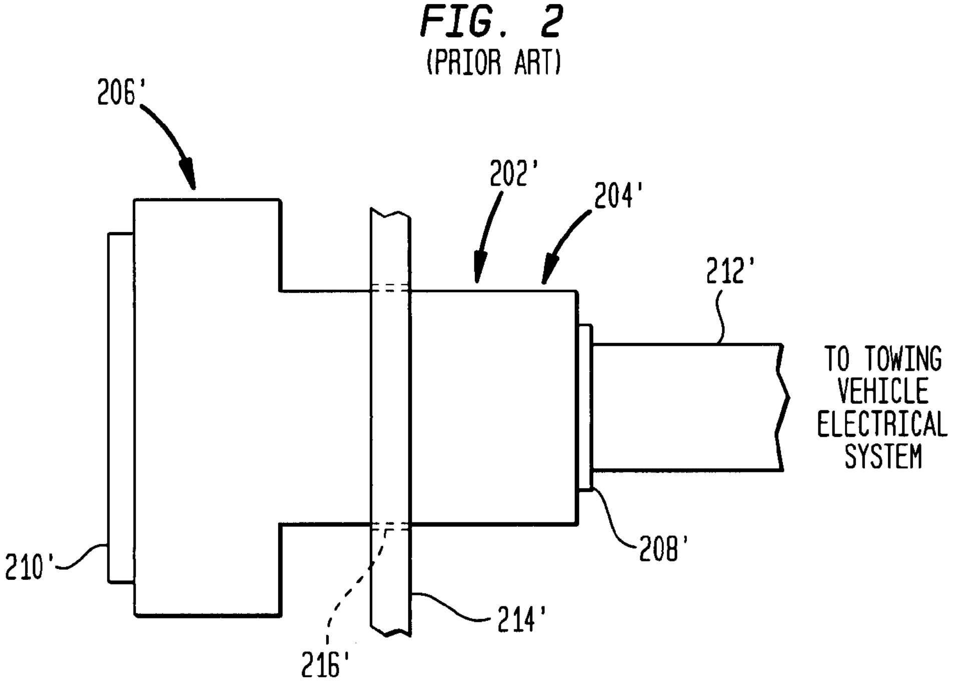
FIG. 2 (PRIOR ART)
FIG. 2 is a top view of a seven-port receptacle installed on a towing vehicle in accordance with the prior art.

Certain terminology may be used in the following description for convenience only and is not limiting. The words "lower" and "upper" and "top" and "bottom" designate directions in the drawings to which reference is made. The terminology includes the words above specifically mentioned, derivatives thereof and words of similar import.

Where a term is provided in the singular, the inventors also contemplate aspects of the invention described by the plural of that term. As used in this specification and in the appended claims, the singular forms "a", "an" and "the" include plural references unless the context clearly dictates otherwise, e.g., "a plug" includes a plurality of plugs. Thus, for example, a reference to "a method" includes one or more methods, and/or steps of the type described herein and/or which will become apparent to those persons skilled in the art upon reading this disclosure.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods, constructs and materials are now described. All publications mentioned herein are incorporated herein by reference in their entirety. Where there are discrepancies in terms and definitions used in references that are incorporated by reference, the terms used in this application shall have the definitions given herein.

Figure 6:
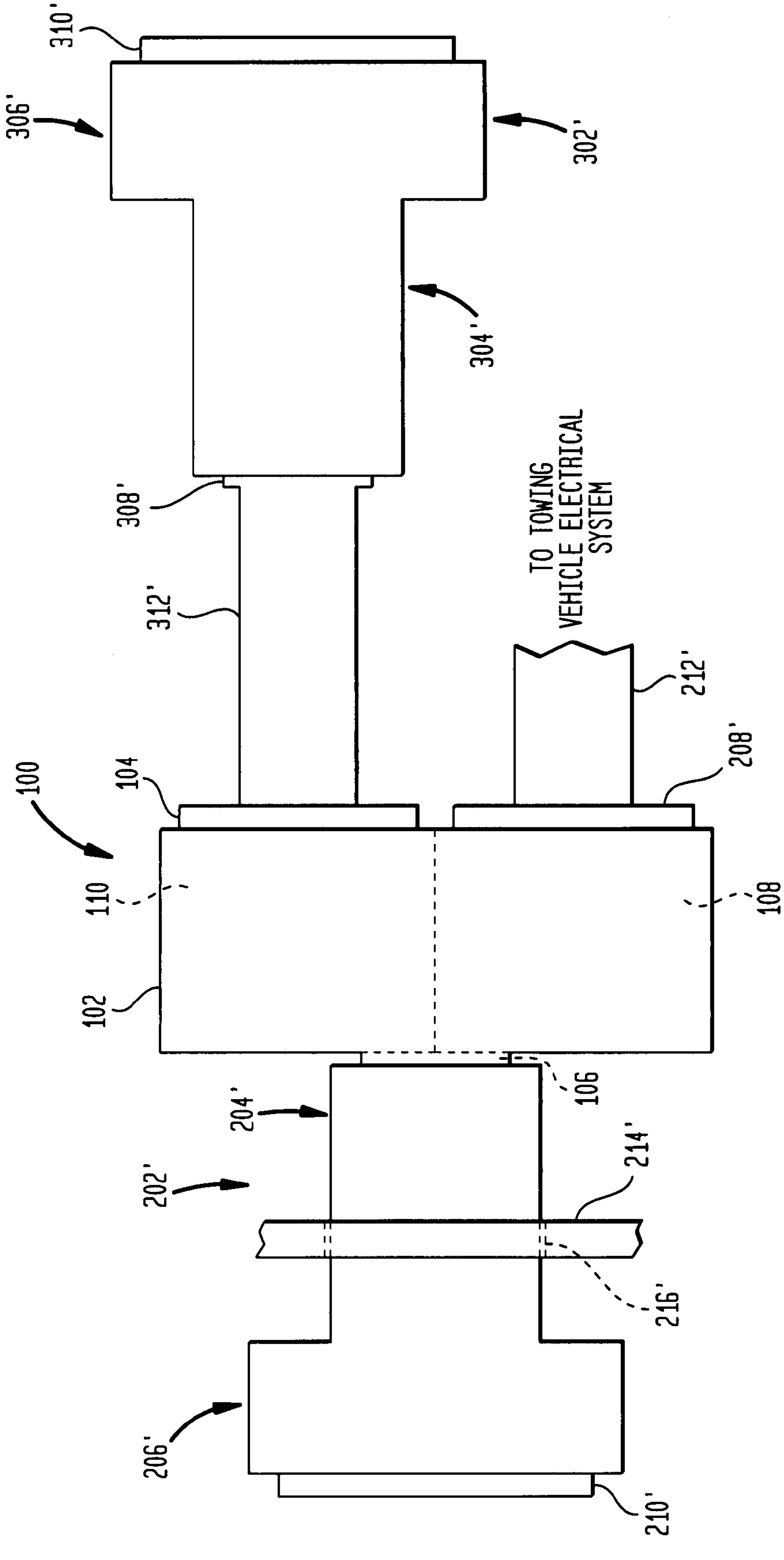
FIG. 6 is a top view of the receptacle adaptor of FIG. 1 installed on a towing vehicle.

Referring first to FIG. 1, depicted is adaptor 100 in accordance with one embodiment of the present invention. Adaptor 100 is an attachment designed to adapt a first seven-way receptacle wired to a towing vehicle's electrical system to power a second seven-way receptacle with zero or minimal modification (e.g., cutting or splicing) of the towing vehicle's electrical system wiring. The elimination or minimization of the need to modify the towing vehicle's electrical system wiring: increases the ease with which a second receptacle may be installed; minimizes the time required to install a second receptacle; eliminates or minimizes the potential for an electrical short, a blown fuse, or other damage that may be caused during rewiring of the towing vehicle's electrical system; minimizes the knowledge required to install the second receptacle (e.g., eliminates the need to understand the towing vehicle's electrical wiring system and/or to trace out the wiring thereof); and increases the safety of installing a second receptacle by minimizing the potential for an electrical shock or other injury to the installer. As depicted in FIG. 6, adaptor 100 is installed between power inlet 204' of a first seven-way receptacle 202' and plug 204', the latter of which is connected to the towing vehicle's electrical system. Adaptor 100 is also wired to the wires (e.g., wires 316') of a second receptacle wiring harness (e.g., wiring harness 312') of a commercially available seven-way receptacle kit (e.g., kit 300') for the purpose of providing power from the towing vehicle's electrical system to a second receptacle (e.g., receptacle 302').

Referring back to FIG. 1, adaptor 100 includes, inter alia, adaptor housing 102 and adaptor plug 104. In one embodiment of the present invention, including that depicted in FIG. 1, adaptor housing 102 is a weatherproof enclosure that protects the interior electrical components and wiring, as discussed in greater detail below, from damage due to precipitation and the like using commercially-known methods. Adaptor housing 102 may be manufactured (e.g., molded) from virtually any durable weatherproof material such as plastic, metal, rubber, and/or graphite. Preferably, such material is non-ignitable and electrically non-conductive. Similarly, locking clip 114 and locking clip apertures 116 and 118, as discussed in greater detail below, are also designed to have weather tight connections using commercially-known methods.

Figure 4A:
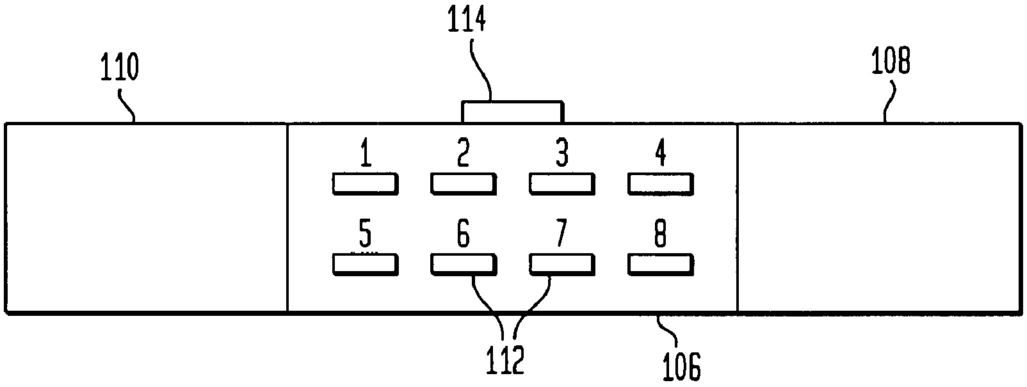
FIG. 4A is a front view of the receptacle adaptor of FIG. 1.

In the embodiment depicted in FIG. 1, adaptor housing 102 also includes three modules (i.e., modules 106, 108, and 110). Module 106 is designed for insertion into the power inlet (e.g., power inlet 204') of a standardized seven port receptacle (e.g., receptacle 202'). That is, module 106 is designed to replicate the configuration of a standard plug (i.e., a plug wired to a towing vehicle's electrical system such as plug 204') intended for insertion into the power inlet of a standardized seven port receptacle. Consequently, in the depicted embodiment, module 106 has a generally square shape, eight prongs 112, and locking clip 114. Each prong 112, other than ground, is a distinct electrical connection wired as discussed in greater detail below with respect to FIG. 7. Along these lines, prongs 112 are formed from an electrically-conductive material such as, but not limited to, copper. As better depicted in FIG. 4A, depicted is the electrical interface for module 106. Prongs 112 are sized and located such that they may be received at the power inlet of a standardized seven way receptacle. Prongs 112 are also labeled 1-8 to identify how each prong 112 is internally wired as discussed in greater detail below with respect to FIG. 7. Although module 106 is depicted as substantially square and having eight prongs 112 for compatibility with one commercially available seven-way receptacle, module 106 may be formed in other shapes and with a differing quantity and/or type (e.g., terminal block, pins, etc.) of electrical connection to make it compatible with other commercially available receptacles including, without limitation, two-way receptacle (e.g., a 12-volt receptacle such as those use as a cigarette lighter receptacle, cell phone charger receptacle, etc.), four-way receptacles, five-way receptacles, six-way receptacles, and seven-way receptacles intended for use with cylindrical plugs. In some such scenarios, the size and shape of the entire adaptor 100 including modules 106, 108, and 110 and adaptor plug 104 may change in shape and size as well as electrical connection type and quantity as needed to accommodate installation in various locations of the towing vehicle. The size, shape, and electrical connections may also be modified as necessary to accommodate the equipment provided with different models of towing vehicles including those having varying manufacturers.

Similarly, locking clip 114 is sized and located relative to module 106 such that it clips into a locking clip aperture located in the power inlet of a standardized seven port receptacle. Locking clip 114 acts to secure adaptor 100 to the power inlet of a standardized seven port receptacle to minimize the potential for disengagement of adaptor 100 from the standardized seven port receptacle. Along these lines, locking clip 114 has an equivalent shape and a slightly smaller dimension than the mating locking clip aperture (i.e., the locking clip aperture located internal to power inlet 204') to allow locking clip 114 to protrude therethrough snugly in a manner that minimizes the potential for latitudinal, longitudinal, and vertical movement of locking clip 114 relative to its corresponding locking clip aperture. Although module 106 is depicted as including locking clip 114 for compatibility with one commercially available seven-way receptacle, module 106 may include other locking mechanisms to make it compatible with other commercially available receptacles including, without limitation, two-way receptacle (e.g., a 12-volt receptacle such as those use as a cigarette lighter receptacle, cell phone charger receptacle, etc.), four-way receptacles, five-way receptacles, six-way receptacles, and seven-way receptacles intended for use with cylindrical plugs.

Referring back to FIG. 1, modules 108 and 110 are designed to receive a standardized plug (e.g., plug 204') intended for insertion into the power inlet (e.g., power inlet 204') of a standardized seven port receptacle (e.g., receptacle 202'). Such standardized plugs have the same configuration as module 106 as described above. In other words, modules 108 and 110 are designed to replicate the configuration of a standard power inlet of a standardized seven port receptacle. Consequently, in the depicted embodiment, modules 108 and 110 have a generally square shape, locking clip apertures 116 and 118, respectively, and eight prong-receiving recesses 420 and 422, respectively (not shown in FIG. 1—see FIG. 4B). Each prong-receiving recess 420 and 422 is a distinct electrical connection wired as discussed in greater detail below with respect to FIG. 7.

Figure 4B:
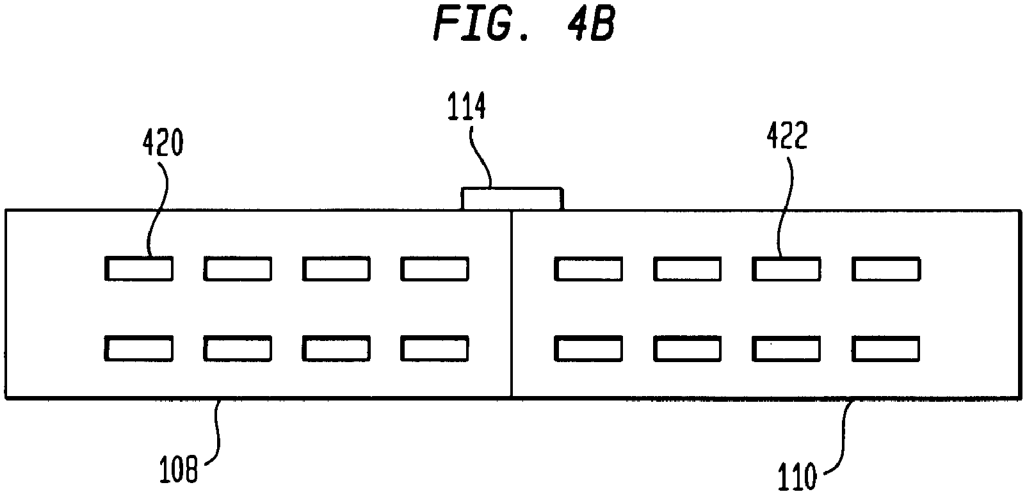
FIG. 4B is a rear view of the receptacle adaptor of FIG. 1 absent its adaptor plug.

FIG. 4B depicts the electrical interfaces for modules 108 and 110. As depicted in FIG. 4B, prong-receiving recesses 420 are sized and located such that they may receive the prongs of a plug connected to the towing vehicle's electrical system (e.g., plug 204') for the purpose of providing an electrical connection between adaptor 100 and the towing vehicle's electrical system. As also depicted in FIG. 4B, prong-receiving recesses 422 are sized and located such that they may receive adaptor plug prongs 120 of adaptor plug 104 for the purpose of providing an electrical connection between adaptor 100 and a second receptacle wired to adaptor plug 104. Along these lines, prong-receiving recesses 420 and 422 are formed from an electrically-conductive material such as, but not limited to, copper. Although modules 108 and 110 are each depicted as substantially square and having eight prong-receiving recesses 420 and 422, respectively, for compatibility with a plug coupled to a towing vehicle's electrical system and adaptor plug 104, module 108 and/or module 110 may be formed in other shapes and with a differing quantity and/or type of electrical connection to make it compatible with plugs coupled to a towing vehicle's electrical system and/or adaptor plugs having varying shapes and/or electrical connections.

Similarly, locking clip apertures 116 and 118 are sized and located relative to modules 108 and 110 such that they receive the locking clips integral to a plug connected to the towing vehicle's electrical system (e.g., plug 204') and adaptor plug locking clip 122, respectively. Locking clip apertures 116 and 118 secure a plug connected to the towing vehicle's electrical system and adaptor plug 104, respectively, to adaptor 100 to minimize the potential for disengagement of same from adaptor 100. Along these lines, locking clip apertures 116 and 118 have an equivalent shape and a slightly larger dimension than the mating locking clips to allow such clips to protrude therethrough snugly in a manner that minimizes the potential for latitudinal, longitudinal, and vertical movement of such locking clips relative to the locking clip apertures 116 and 118. Although modules 108 and 110 are depicted as including locking clip apertures 116 and 118 for compatibility with commercially available plugs and the depicted design of adaptor plug 104, modules 108 and/or 110 may include other locking mechanisms to make it compatible with other commercially available plugs and/or adaptor plugs having varying locking mechanisms.

Figure 5A:
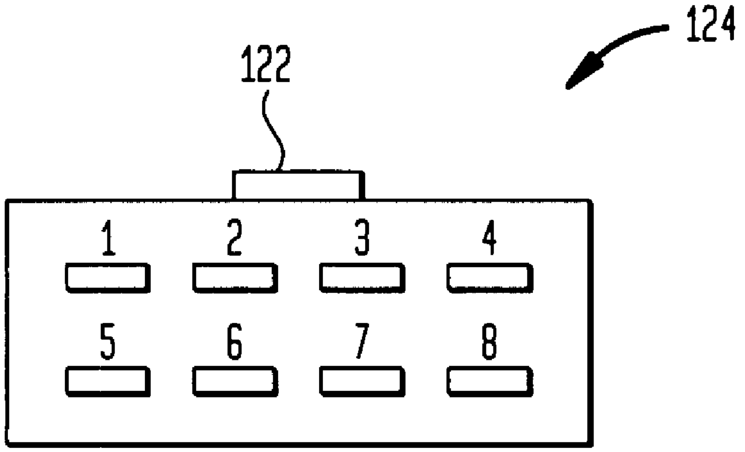
FIG. 5A is a front view of the adaptor plug of FIG. 1.
Figure 5B:
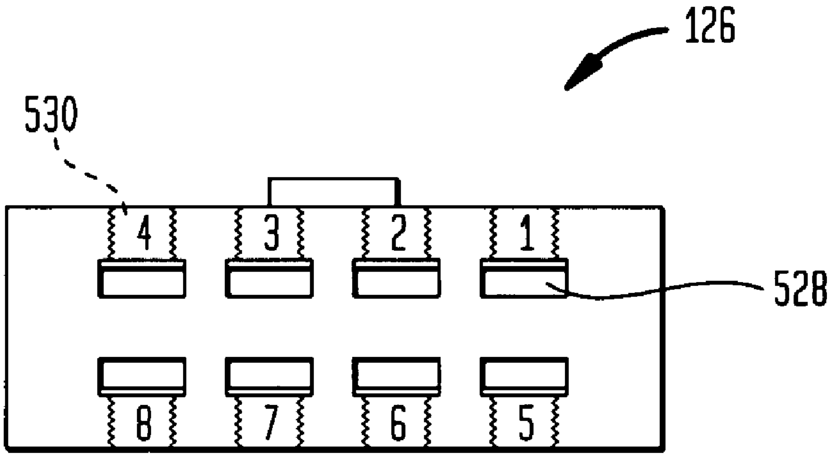
FIG. 5B is a rear view of the adaptor plug of FIG. 1 absent its wiring shield.

Now referring to FIGS. 1, 5A, and 5B, adaptor plug 104 includes adaptor plug front and rear ends 124 and 126, respectively, and wiring shield 128. Adaptor plug front end 124 is designed to replicate the configuration of a standard plug (i.e., a plug wired to a towing vehicle's electrical system such as plug 204') intended for insertion into the power inlet of a standardized seven port receptacle. This is done for the purposes of, inter alia, simplifying manufacturing as plug front end 124 may have virtually any design that mates electrically with module 110 of adaptor 100.

As depicted in FIG. 5A, adaptor plug front end 124 has a generally square shape, eight prongs 120, and locking clip 122. Each prong 120, other than ground, is a distinct electrical connection wired as discussed in greater detail below with respect to FIG. 7. Along these lines, prongs 120 are formed from an electrically-conductive material such as, but not limited to, copper. As better depicted in FIG. 5A, prongs 120 are sized and located such that they may be received by prong-receiving recesses 422 of module 110. Prongs 112 are also labeled 1-8 to identify how each prong 120 is internally wired and connected to terminal blocks 528 of adaptor plug rear end 126 as depicted in FIG. 5B. Although adaptor plug front end 124 is depicted as substantially square and having eight prongs 120 for compatibility with prong-receiving recesses 422 of module 110, adaptor plug front end 124 may be formed in other shapes and with a differing quantity and/or type (e.g., terminal block, pins, etc.) of electrical connection points to make it compatible with modules 110 having varying shapes and electrical connections points.

Adaptor plug 104 also includes locking clip 122, which is sized and located relative to adaptor plug 104 such that it clips into locking clip aperture 118 of module 110. Locking clip 122 acts to secure adaptor plug 104 to adaptor housing 102 to minimize the potential for disengagement of adaptor plug 104 therefrom. Along these lines, locking clip 122 has an equivalent shape and a slightly smaller dimension than locking clip aperture 118 to allow locking clip 122 to protrude therethrough snugly in a manner that minimizes the potential for latitudinal, longitudinal, and vertical movement of locking clip 122 relative to locking clip aperture 118. Although adaptor plug 104 is depicted as including locking clip 122 for compatibility with locking clip aperture 118 of module 110, adaptor plug 104 and module 110 may include other forms of compatible locking mechanisms without departing from the scope of the present invention.

Figure 3:
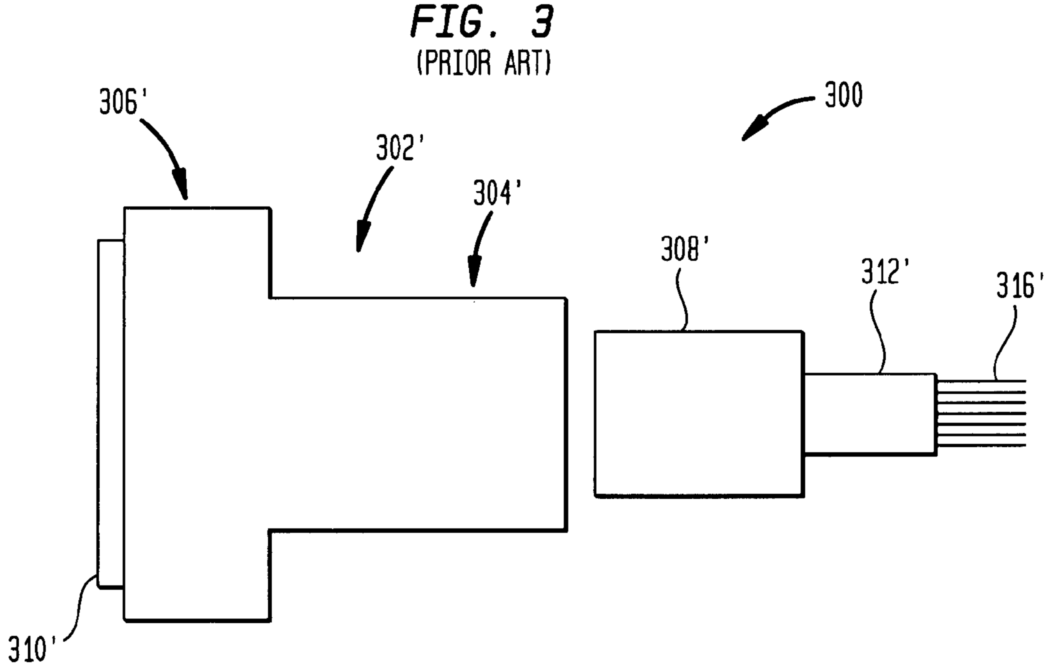
FIG. 3 (PRIOR ART)
FIG. 3 is a top view of a seven-port receptacle kit in accordance with the prior art.

Referring now to FIG. 5B, depicted is adaptor plug rear end 126 with wiring shield 128 removed. As shown, adaptor plug rear end includes eight terminal blocks 528. Each terminal block 528 is wired internal to adaptor plug 104 to a corresponding prong 120 (i.e., the terminal block 528 labeled "1" is wired to the prong 120 labeled "1", the terminal block 528 labeled "2" is wired to the prong 120 labeled "2", etc.) via commercially known methods. Terminal blocks 528 accept the wiring of a second receptacle to be powered by adaptor 100 such as receptacle 302' as depicted in FIG. 6. When a commercially available receptacle kit such as kit 300 is used in conjunction with the present invention to install the second receptacle, wires 316' (FIG. 3) are inserted into the corresponding terminal block 528. After insertion, closure mechanism 530 (e.g., a screw) is tightened to hold the corresponding wire 316' in place within the corresponding terminal block 528. Although adaptor plug rear end 126 is depicted as having terminal blocks 528, virtually any other apparatus for wiring adaptor plug 104 to a second receptacle may be substituted without departing from the scope of the present invention.

Once wires 316' have been connected to terminal blocks 528, wiring shield 128 may be slid over wires 316' until its proximal end abuts adaptor plug rear end 126. Wiring shield 128 may be virtually any commercially available wiring shield for protecting wiring and wiring connections in outdoor environments. In some embodiments of the present invention, wiring shield 128 is a rubber or rubber-coated wiring shield having a bore therethrough through which wires 316' are passed prior to wiring same to adaptor plug 104. In some embodiments of the present invention, adaptor plug 104 may include a recess or the like to allow weather shield 128 to be inserted therein for a more secure fit as is commercially known. Optionally, an O-ring may be included in the recess to prevent contaminants (e.g., rain, dirt, snow, etc.) from damaging or corroding wires 316', terminal blocks 528, and/or adaptor plug 104. Virtually any apparatus or method for protecting wires 316' terminal blocks 528, and/or adaptor plug 104 may be added or substituted without departing from the scope of the present invention.

After the second receptacle to be powered by adaptor 100 has been wired to adaptor plug 104, adaptor plug 104 is inserted into module 110 (FIG. 1) to: secure adaptor 104 thereto; to enclose adaptor 104 in the weatherproof housing of module 110/adaptor housing 102; and to complete the electrical connection between the wiring of the second receptacle and the towing vehicle's electrical system as better depicted in FIG. 6.

Turning next to FIG. 6, depicted is an adaptor 100 coupled to a first receptacle 202' and a second receptacle 302'. As depicted, plugging prongs 120 of adaptor plug 104 into the corresponding prong-receiving recesses 422 of module 110 couples prongs 120 (and therefore the second receptacle wiring coupled thereto) electrically to prong-receiving recesses 420 of module 108. Since these recesses 420 are electrically connected to the towing vehicle's electrical system via the insertion of plug 204' into module 108, power is provided from the towing vehicle's electrical system to the prongs of plug 204' to prong-receiving recesses 420 of module 108 through the internal wiring of adaptor 100 (see FIG. 7) to prong-receiving recesses 422 of module 110 to the wiring of the added receptacle. Simultaneously, power is also provided from the towing vehicle's electrical system to the prongs of plug 204' to prong-receiving recesses 420 of module 108 through the internal wiring of adaptor 100 (see FIG. 7) to prongs 112 of module 106 to the internal prong-receiving recesses of the first receptacle (e.g., receptacle 202').

Figure 7:
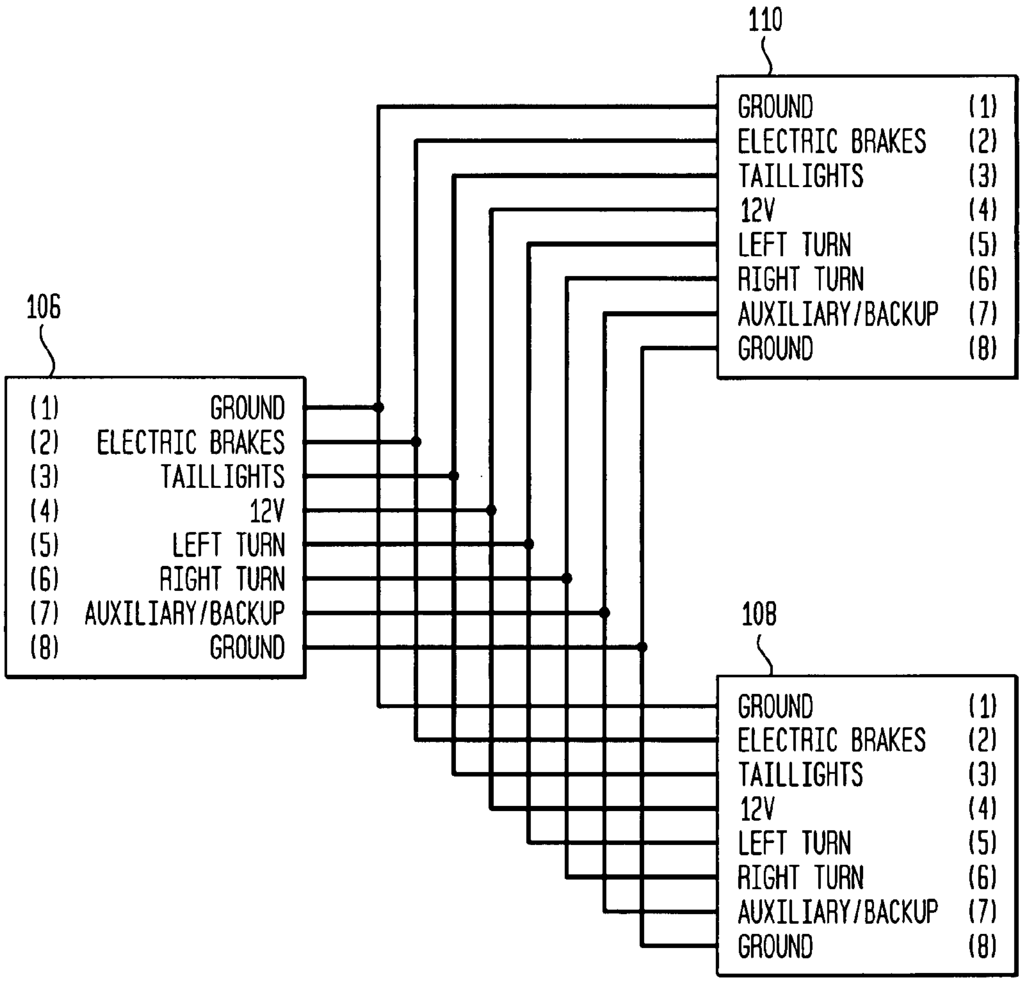
FIG. 7 is a schematic of the internal wiring of the receptacle adaptor of FIG. 1 in accordance with one embodiment of the present invention.

Referring next to FIG. 7, depicted is a schematic of the internal wiring of adaptor 100. As shown, each prong 112 of module 106 is wired to the corresponding prong-receiving recess 420 and 422 of module 108 and 110, respectively. That is, the prong 112 labeled as "1" is wired to the prong-receiving recesses 420 and 422 that are labeled as "1", the prong 112 labeled as "2" is wired to the prong-receiving recesses 420 and 422 that are labeled as "2", etc. In one aspect of the present invention, the internal wiring of adaptor 100 is 14-gauge wire, however, alternate sizes (e.g., 16-gauge wire) and/or materials (e.g., a circuit board) may be substituted without departing from the scope of the present invention. Also, the wiring of adaptor 100 may be varied as necessary to accommodate varying electrical connections of: varying electrical plugs connected to a towing vehicle's electrical system; varying adaptor plugs 104; and/or varying first receptacles including, without limitation, two-way receptacle (e.g., a 12-volt receptacle such as those use as a cigarette lighter receptacle, cell phone charger receptacle, etc.), four-way, five-way, six-way, and seven-way receptacles.

Although adaptor 100 of FIGS. 1 through 7 allows a second seven-way receptacle to be powered by a first seven-way receptacle, alternate embodiments of the present invention are envisioned in which the second receptacle is of a varying type including, without limitation, two-way (e.g., a 12-volt receptacle such as those use as a cigarette lighter receptacle, cell phone charger receptacle, etc.), four-way, five-way, six-way, and seven-way receptacles. This allows a user to add a receptacle that is compatible with a desired towed object (e.g., a four-way receptacle) to an existing receptacle that is incompatible with the desired towed object (e.g., a seven-way receptacle). Also, adaptor 100 may be modified as necessary to allow any type of second receptacle to be added to any type of first receptacle including, without limitation, two-way (e.g., a 12-volt receptacle such as those use as a cigarette lighter receptacle, cell phone charger receptacle, etc.), four-way, five-way, six-way, and seven-way receptacles, by modifying the size and shape thereof as well as the quantity and type of electrical connections.

Additionally, adaptor 100 may optionally include a fuse to prevent a current overdraw. However, in the embodiment depicted in FIGS. 1-7, current is limited by the existing fuse of the towing vehicle's electrical system. In some uses of adaptor 100, the size of this fuse may be increased (e.g., a 5-amp fuse may be replaced with a 10-amp fuse) to accommodate the anticipated current draw of the towed object(s).

Furthermore, although adaptor 100 is depicted as a separate and distinct unit from the first receptacle, embodiments of the present invention are envisioned in which adaptor 100 is included with and/or is an integral component of the first receptacle. That is, adaptor 100 may be manufactured by the first receptacle manufacturer as an integral component of the first receptacle.

In addition, although adaptor 100 is depicted as having an adaptor plug 104 to which the second receptacle is wired, adaptor plug 104 may be omitted without departing from the scope of the present invention. In such a scenario, the terminal strips to which the second receptacle is wired will be included as a part of module 110 rather than as a part of adaptor plug 104. In this scenario, prong receiving recesses 422 of module 110 are no longer needed as the wires such as wires 316' will be directly wired to module 110. Module 110 may optionally include a recess or other mechanism as needed for compatibility with weather shield 128. However, the use of an adaptor plug such as adaptor plug 104 allows such plug to be distributed with, or as an integral part of, a receptacle kit such as kit 300'. Or, such plug may be integral to the wiring harness such as wiring harness 312' (e.g., the plug may be wired to wires 316' by the manufacturer of kit 300') to facilitate installation of the second receptacle of kit 300' to a first receptacle.

Figure 8:
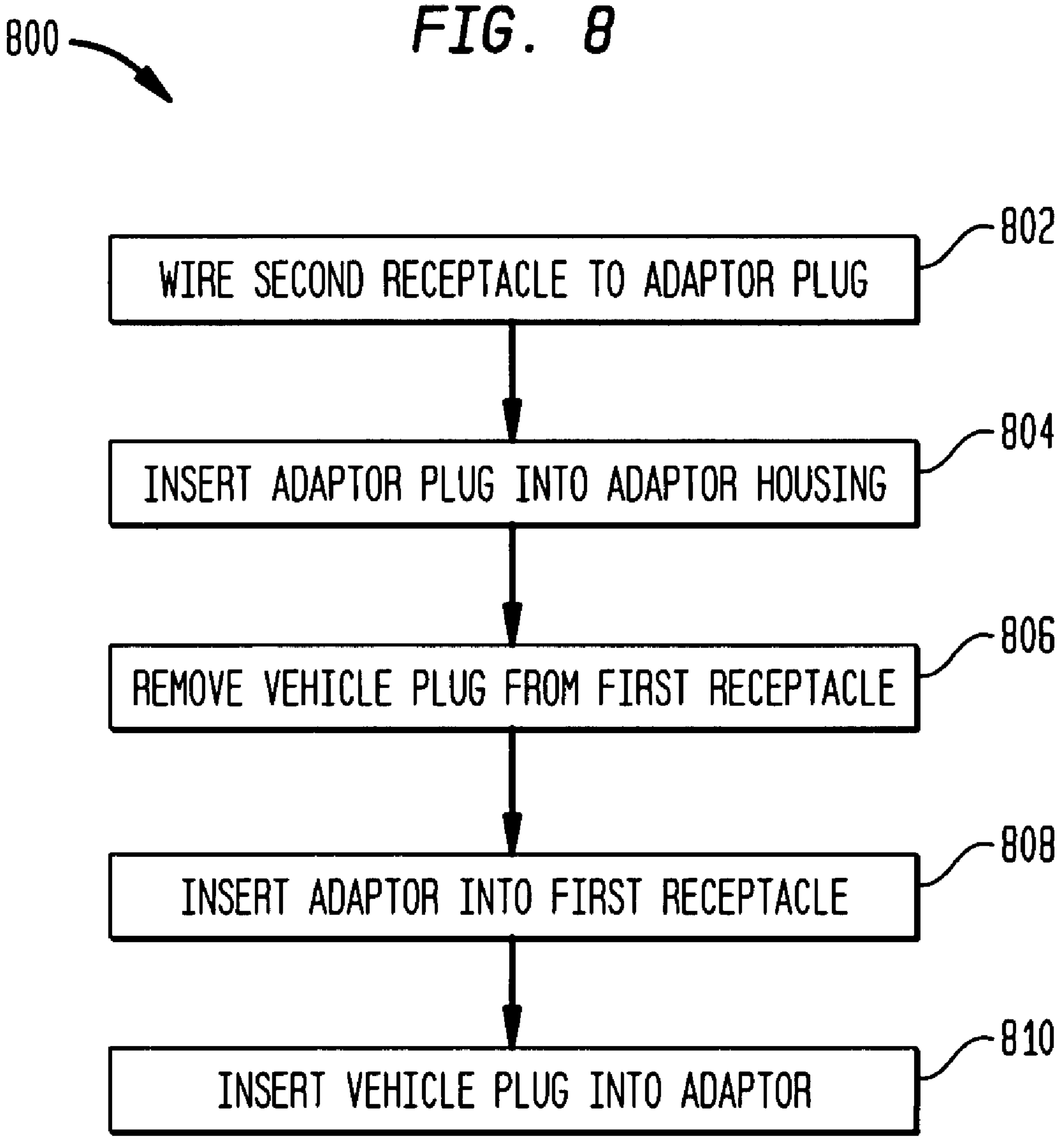
FIG. 8 is a flowchart of a method for adapting a first seven-way receptacle wired to a towing vehicle's electrical system to power a second seven-way receptacle in accordance with one embodiment of the present invention.

Turning next to FIG. 8, depicted is a flowchart of a method for adapting a first receptacle (e.g., receptacle 202') wired to a towing vehicle's electrical system to power a second receptacle (e.g., receptacle 302') in accordance with one embodiment of the present invention. Method 800 begins at 802, at which the second receptacle is wired to an adaptor plug (e.g., adaptor plug 104) as discussed in greater detail above. Method 800 then proceeds to 804.

At 804, the adaptor plug, which is now wired to the second receptacle, is inserted into adaptor housing 102 as discussed in greater detail above. It should be noted that alternate embodiments of the present invention are envisioned in which the second receptacle may be wired directly to adaptor housing 102, thereby eliminating the need for an adaptor plug. In such embodiments of the present invention, the second receptacle is wired directly to the adaptor housing in step 802 and step 804 is omitted.

Method 800 then proceeds to 806, at which the plug connected to the towing vehicle's electrical system is removed from the first receptacle (e.g., receptacle 202'). Thereafter, method 800 proceeds to 808, at which an adaptor in accordance with the present invention is plugged into the first receptacle. In the embodiment depicted in FIG. 6, module 106 of adaptor 100 is plugged into power inlet 204' of first receptacle 202'. During this step, the adaptor may be locked in place via an integral locking mechanism such as a locking clip and corresponding locking clip aperture. Process 800 then proceeds to 810.

At 810, the plug removed from the first receptacle in step 806 (i.e., the plug connected to the towing vehicle's electrical system) is now inserted into the adaptor. Such insertion re-establishes the electrical connection between the towing vehicle's electrical system and the first receptacle while also establishing a new electrical connection between the towing vehicle's electrical system and the second receptacle. Using this method, the adaptor of the present invention adapts a first receptacle wired to a towing vehicle's electrical system to power a second receptacle with zero or minimal modification (e.g., cutting or splicing) of the towing vehicle's electrical system wiring.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method for adapting a first towing vehicle receptacle coupled to an electrical system of a towing vehicle to power a second receptacle via said electrical system via an adaptor comprising the steps of:

- removing a towing vehicle plug connected to said electrical system of said towing vehicle from a power inlet of said first towing vehicle receptacle;
- inserting a first interface of said adaptor into said power inlet, said adaptor including:
  - a housing;
  - a first module located internal to said housing, said first module including said first interface, said first interface configured to mate with said power inlet;
  - a second module located internal to said housing, said second module including a second interface, said second interface configured to mate with said towing vehicle plug, said second interface electrically connected to said first interface;
  - a third module located internal to said housing, said third module including a third interface, said third interface electrically connected to said first interface and said second interface; and
  - an adaptor plug, said adaptor plug configured to mate with said third interface, said adaptor plug configured to directly receive a plurality of wires coupled to said second receptacle;
- inserting said towing vehicle plug into said second interface;
- wiring said plurality of wires to said adaptor plug; and
- inserting said adaptor plug into said third interface.

2. A method according to claim 1, wherein said housing is weatherproof.

3. A method according to claim 1, wherein said adaptor plug includes a plurality of terminal blocks.

4. A method according to claim 1, wherein at least one of the group consisting of said first interface, said second interface, and said third interface includes at least one of the group consisting of a prong, a prong-receiving recess, and combinations thereof.

5. A method according to claim 1, wherein said adaptor further comprises:

a wiring shield.

6. A method according to claim 1, wherein at least one of the group consisting of said first module, said second module, said third module, and combinations thereof includes at least a portion of a locking mechanism.

7. A method according to claim 1, wherein said first receptacle is at least one of the group consisting of a two-way receptacle, a four-way receptacle, a five-way receptacle, a six-way receptacle, and a seven-way receptacle.

8. A method according to claim 1, wherein power is provided from said electrical system to said first receptacle and said second receptacle via said adaptor.

9. A method for adapting a first towing vehicle receptacle coupled to an electrical system of a towing vehicle to power a second receptacle via said electrical system via an adaptor comprising the steps of:

removing a towing vehicle plug connected to said electrical system of said towing vehicle from a power inlet of said first towing vehicle receptacle;

inserting a first interface of said adaptor into said power inlet, said adaptor including:

a housing;

a first module located internal to said housing, said first module including said first interface, said first interface configured to mate with said power inlet;

a second module located internal to said housing, said second module including a second interface, said second interface configured to mate with said towing vehicle plug, said second interface electrically connected to said first interface; and a third module located internal to said housing, said third module including a third interface configured to directly mate with plurality of wires coupled to said second receptacle, said third interface electrically connected to said first interface and said second interface;

inserting said towing vehicle plug into said second interface; and coupling said third interface to said second receptacle.

10. A method according to claim 9, wherein at least one of the group consisting of said first module, said second module, said third module, and combinations thereof includes at least a portion of a locking mechanism.

11. A method according to claim 9, wherein said housing is weatherproof.

* * * * *